US012620946B2

(12) United States Patent
Sumiyoshi

(10) Patent No.: US 12,620,946 B2
(45) Date of Patent: May 5, 2026

(54) OUTPHASING AMPLIFIER AND SIGNAL PROCESSOR FOR OUTPHASING AMPLIFIER

(71) Applicant: Sumitomo Electric Industries, Ltd., Osaka (JP)

(72) Inventor: Takashi Sumiyoshi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 486 days.

(21) Appl. No.: 18/113,443

(22) Filed: Feb. 23, 2023

(65) Prior Publication Data

US 2023/0412128 A1 Dec. 21, 2023

(30) Foreign Application Priority Data

Jun. 9, 2022 (JP) ................................. 2022-093857

(51) Int. Cl.
  *H03F 3/193* (2006.01)
  *H03F 1/02* (2006.01)
  (Continued)

(52) U.S. Cl.
  CPC ........... *H03F 3/193* (2013.01); *H03F 1/0294* (2013.01); *H03F 1/3205* (2013.01); *H03F 1/56* (2013.01);
  (Continued)

(58) Field of Classification Search
  CPC ........ H03F 1/3205; H03F 3/193; H03F 3/195; H03F 2200/451; H03F 1/56; H03F 3/245;
  (Continued)

(56) References Cited

U.S. PATENT DOCUMENTS 7,358,806 B2 * 4/2008 Burns ..................... H03F 3/211
                                                       330/124 R
8,755,454 B2 * 6/2014 Sorrells ................... H04B 7/10
                                                       375/295
(Continued)

FOREIGN PATENT DOCUMENTS

DE      102016118541 A1 * 5/2017 .......... H03F 1/0294
JP      2020-156023 A      9/2020
WO      WO-2023216847 A1 * 11/2023 .......... H03F 1/0288

*Primary Examiner* — Andrea Lindgren Baltzell
*Assistant Examiner* — Lance Torbjorn Bartol
(74) *Attorney, Agent, or Firm* — Volpe Koenig

(57) ABSTRACT

An outphasing amplifier includes a first amplifier, a second amplifier, a first coupler coupling a first signal and a third signal, a second coupler coupling a second signal and a fourth signal, a first impedance converter inputting the first signal coupled with the third signal, a second impedance converter inputting the second signal coupled with the fourth signal, a combiner combining the first and the second signals output from the first and the second impedance converters and outputting an output signal, and a signal processor outputting the first signal having a first phase to the first amplifier, outputting the second signal having a second phase to the second amplifier, outputting the third signal having at least one of a third phase and a first amplitude to the first coupler, and outputting the fourth signal having at least one of a fourth phase and a second amplitude to the second coupler.

9 Claims, 17 Drawing Sheets

(51) Int. Cl.
 | | |
 | --- | --- |
 | *H03F 1/32* | (2006.01) |
 | *H03F 1/56* | (2006.01) |
 | *H03F 3/21* | (2006.01) |
 | *H03F 3/24* | (2006.01) |
 | *H03F 3/68* | (2006.01) |

(52) U.S. Cl.
 CPC ............. *H03F 3/211* (2013.01); *H03F 3/245* (2013.01); *H03F 3/68* (2013.01); *H03F 2200/204* (2013.01); *H03F 2200/222* (2013.01); *H03F 2200/387* (2013.01); *H03F 2200/451* (2013.01)

(58) Field of Classification Search
 CPC ...... H03F 3/211; H03F 3/68; H03F 2200/222; H03F 2200/387; H03F 2200/204; H03F 1/0294
 USPC ......................................................... 330/277
 See application file for complete search history.

(56) References Cited

U.S. PATENT DOCUMENTS

| | | | | |
| --- | --- | --- | --- | --- |
| 9,240,761 B1 * | 1/2016 | Reyland, Jr. | .......... | H03F 1/3247 |
| 2002/0101938 A1 * | 8/2002 | Horaguchi | ........... | H03F 1/3247 |
| | | | | 375/297 |
| 2011/0255575 A1 * | 10/2011 | Zhu | ...................... | H04B 1/0475 |
| | | | | 375/219 |

\* cited by examiner

FIG. 12

TABLE 24a

| f (Sc2) | Po (Sc1) | Φ1 | A1 |
|---------|----------|------|------|
| f1 | Po1 | Φ111 | A111 |
| f1 | Po2 | Φ112 | A112 |
| f1 | Po3 | Φ113 | A113 |
| f1 | ⋮ | ⋮ | ⋮ |
| f1 | Pon | Φ11n | A11n |
| f2 | Po1 | Φ121 | A121 |
| f2 | Po2 | Φ122 | A122 |
| f2 | Po3 | Φ123 | A123 |
| f2 | ⋮ | ⋮ | ⋮ |
| f2 | Pon | Φ12n | A12n |

FIG. 13

TABLE 24b

| f(Sc2) | Po(Sc1) | Φ2 | A2 |
|---|---|---|---|
| f1 | Po1 | Φ211 | A211 |
| f1 | Po2 | Φ212 | A212 |
| f1 | Po3 | Φ113 | A213 |
| f1 | ⋮ | ⋮ | ⋮ |
| f1 | Pon | Φ21n | A21n |
| f2 | Po1 | Φ221 | A221 |
| f2 | Po2 | Φ222 | A222 |
| f2 | Po3 | Φ223 | A223 |
| f2 | ⋮ | ⋮ | ⋮ |
| f2 | Pon | Φ22n | A22n |

FIG. 14

TABLE 24c

| f (Sc2) | Po (Sc1) | Φ3 | A3 |
|---------|----------|-----|-----|
| f1 | Po1 | Φ311 | A311 |
| f1 | Po2 | Φ312 | A312 |
| f1 | Po3 | Φ313 | A313 |
| f1 | ⋮ | ⋮ | ⋮ |
| f1 | Pon | Φ31n | A31n |
| f2 | Po1 | Φ321 | A321 |
| f2 | Po2 | Φ322 | A322 |
| f2 | Po3 | Φ323 | A323 |
| f2 | ⋮ | ⋮ | ⋮ |
| f2 | Pon | Φ32n | A32n |

FIG. 15

TABLE 24d

| f (Sc2) | Po (Sc1) | $\Phi 4$ | A4 |
|---|---|---|---|
| f1 | Po1 | $\Phi 411$ | A411 |
| f1 | Po2 | $\Phi 412$ | A412 |
| f1 | Po3 | $\Phi 413$ | A413 |
| f1 | ⋮ | ⋮ | ⋮ |
| f1 | Pon | $\Phi 41n$ | A41n |
| f2 | Po1 | $\Phi 421$ | A421 |
| f2 | Po2 | $\Phi 422$ | A422 |
| f2 | Po3 | $\Phi 423$ | A423 |
| f2 | ⋮ | ⋮ | ⋮ |
| f2 | Pon | $\Phi 42n$ | A42n |

OUTPHASING AMPLIFIER AND SIGNAL PROCESSOR FOR OUTPHASING AMPLIFIER

CROSS REFERENCE TO RELATED APPLICATIONS

This application claims priority based on Japanese Patent Application No. 2022-093857 filed on Jun. 9, 2022, and the entire contents of the Japanese patent applications are incorporated herein by reference.

FIELD

The present disclosure relates to an outphasing amplifier and a signal processor for the outphasing amplifier.

BACKGROUND

There is known an outphasing amplifier as an amplifier for amplifying a high frequency signal such as a microwave. The outphasing amplifier includes a signal processor that outputs two signals from an input signal as two signals having different phases with a constant amplitude depending on the amplitude of the input signal, two amplifiers that amplify the two signals output from the signal processor, respectively, and a combiner that combines the two output signals amplified by the two amplifiers as a single output signal. It is known that a Chireix combiner is used as the combiner (for example, Patent Document 1: Japanese Patent Application Laid-Open No. 2020-156023).

SUMMARY

An outphasing amplifier according to the present disclosure includes: a first amplifier that amplifies a first signal; a second amplifier that amplifies a second signal; a first coupler that couples the first signal amplified by the first amplifier and a third signal; a second coupler that couples the second signal amplified by the second amplifier and a fourth signal; a first impedance converter to which the first signal coupled with the third signal is input; a second impedance converter to which the second signal coupled with the fourth signal is input; a combiner that combines the first signal output from the first impedance converter and the second signal output from the second impedance converter and outputs a combined signal as an output signal; and a signal processor that sets a first phase of the first signal to a value associated with first information relating to a power of the output signal, outputs the first signal in which the first phase is set to the first amplifier, sets a second phase of the second signal to the value associated with the first information, outputs the second signal in which the second phase is set to the second amplifier, sets at least one of a third phase and a first amplitude of the third signal to the value associated with the first information, outputs the third signal in which the at least one of the third phase and the first amplitude is set to the first coupler, and sets at least one of a fourth phase and a second amplitude of the fourth signal to the value associated with the first information, and outputs the fourth signal in which the at least one of the fourth phase and the second amplitude is set to the second coupler.

An outphasing amplifier according to the present disclosure includes: a first amplifier that amplifies a first signal; a second amplifier that amplifies a second signal; a first coupler that couples the first signal amplified by the first amplifier and a third signal; a second coupler that couples the second signal amplified by the second amplifier and a fourth signal; a first impedance converter to which the first signal coupled with the third signal is input; a second impedance converter to which the second signal coupled with the fourth signal is input; and a combiner that combines the first signal output from the first impedance converter and the second signal output from the second impedance converter and outputs a combined signal as an output signal; wherein a first phase of the first signal input to the first amplifier is a value associated with information relating to a power of the output signal, a second phase of the second signal input to the second amplifier is the value associated with the information, at least one of a third phase and a first amplitude of the third signal input to the first coupler is the value associated with the information, and at least one of a fourth phase and a second amplitude of the fourth signal input to the second coupler is the value associated with the information.

A signal processor for an outphasing amplifier according to the present disclosure includes: a first processor that acquires information relating to a power of an output signal, sets a first phase of a first signal to a value associated with the information, and outputs the first signal in which the first phase is set to a first amplifier amplifying the first signal; a second processor that acquires the information, sets a second phase of a second signal to the value associated with the information, and outputs the second signal in which the second phase is set to a second amplifier amplifying the second signal; a third processor that acquires the information, sets at least one of a third phase and a first amplitude of a third signal to the value associated with the information, and outputs the third signal in which the at least one of the third phase and the first amplitude is set to a first coupler coupling the first signal amplified by the first amplifier and the third signal; and a fourth processor that acquires the information, sets at least one of a fourth phase and a second amplitude of a fourth signal to the value associated with the information, and outputs the fourth signal in which the at least one of the fourth phase and the second amplitude is set to a second coupler coupling the second signal amplified by the second amplifier and the fourth signal; wherein the output signal is a signal in which the first signal outputted from a first impedance converter to which the first signal coupled with the third signal is inputted and the second signal outputted from a second impedance converter to which the second signal coupled with the fourth signal is inputted are combined with each other.

BRIEF DESCRIPTION OF DRAWINGS

FIG. 12 is a diagram illustrating a table 24*a* according to the first embodiment.

FIG. 13 is a diagram illustrating a table 24*b* according to the first embodiment.

FIG. 14 is a diagram illustrating a table 24*c* according to the first embodiment.

FIG. 15 is a diagram illustrating a table 24*d* according to the first embodiment.

DETAILED DESCRIPTION OF EMBODIMENTS

Figure 1:
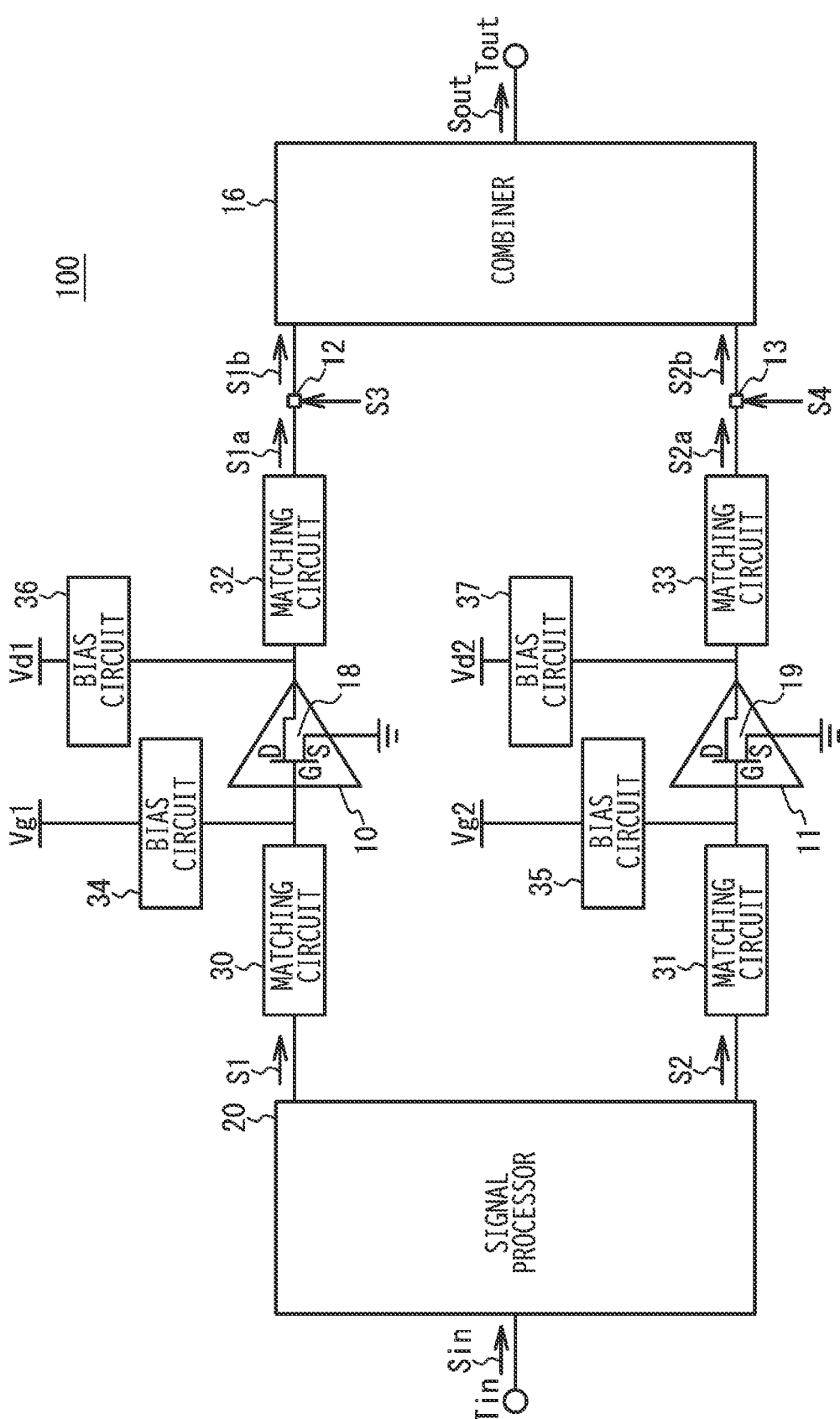
FIG. 1 is a block diagram of an amplifier according to a first embodiment.

By using the Chireix combiner, an impedance viewed from the amplifier to the combiner can be set to improve characteristics. However, the impedance viewed from the amplifier to the combiner may deviate from an optimal value due to changes in the phase and frequency of the two signals. This deviation of the impedance from the optimal value degrades the high frequency characteristics such as a drain efficiency of the outphasing amplifier.

The present disclosure has been made in view of the above problems, and an object of the present disclosure is to improve the high frequency characteristics of the outphasing amplifier.

Details of Embodiments of the Present Disclosure

First, the contents of the embodiments of this disclosure are listed and explained.

(1) An outphasing amplifier according to the present disclosure includes: a first amplifier that amplifies a first signal; a second amplifier that amplifies a second signal; a first coupler that couples the first signal amplified by the first amplifier and a third signal; a second coupler that couples the second signal amplified by the second amplifier and a fourth signal; a first impedance converter to which the first signal coupled with the third signal is input; a second impedance converter to which the second signal coupled with the fourth signal is input; a combiner that combines the first signal output from the first impedance converter and the second signal output from the second impedance converter and outputs a combined signal as an output signal; and a signal processor that sets a first phase of the first signal to a value associated with first information relating to a power of the output signal, outputs the first signal in which the first phase is set to the first amplifier, sets a second phase of the second signal to the value associated with the first information, outputs the second signal in which the second phase is set to the second amplifier, sets at least one of a third phase and a first amplitude of the third signal to the value associated with the first information, outputs the third signal in which the at least one of the third phase and the first amplitude is set to the first coupler, and sets at least one of a fourth phase and a second amplitude of the fourth signal to the value associated with the first information, and outputs the fourth signal in which the at least one of the fourth phase and the second amplitude is set to the second coupler. Thereby, an impedance viewed from the first amplifier to the first impedance converter and an impedance viewed from the second amplifier to the second impedance converter and can be finely adjusted. Therefore, the characteristics can be improved.

(2) In the above (1), the signal processor may set the third phase and the first amplitude to the value associated with the first information, and set the fourth phase and the second amplitude to the value associated with the first information.

(3) In the above (1) or (2), the signal processor may set the first phase to a value associated with the first information and second information relating to a frequency of the output signal, set the second phase to the value associated with the first information and the second information, set the at least one of the third phase and the first amplitude to the value associated with the first information and the second information, and set the at least one of the fourth phase and the second amplitude to the value associated with the first information and the second information.

(4) In any one of (1) to (3) above, the first signal, the second signal, the third signal, and the fourth signal may have a same frequency.

(5) In any one of (1) to (4) above, the signal processor may include a memory that stores a first table in which the first information and the first phase are associated with each other, stores a second table in which the first information and the second phase are associated with each other, stores a third table in which the first information and the at least one of the third phase and the first amplitude are associated with each other, and stores a fourth table in which the first information and the at least one of the fourth phase and the second amplitude are associated with each other, and the signal processor may set the first phase based on the first table, set the second phase based on the second table, set the at least one of the third phase and the first amplitude based on the third table, and set the at least one of the fourth phase and the second amplitude based on the fourth table.

(6) In any one of (1) to (5) above, the combiner may be a Chireix combiner.

(7) An outphasing amplifier according to the present disclosure includes: a first amplifier that amplifies a first signal; a second amplifier that amplifies a second signal; a first coupler that couples the first signal amplified by the first amplifier and a third signal; a second coupler that couples the second signal amplified by the second amplifier and a fourth signal; a first impedance converter to which the first signal coupled with the third signal is input; a second impedance converter to which the second signal coupled with the fourth signal is input; and a combiner that combines the first signal output from the first impedance converter and the second signal output from the second impedance converter and outputs a combined signal as an output signal; wherein a first phase of the first signal input to the first amplifier is a value associated with information relating to a power of the output signal, a second phase of the second signal input to the second amplifier is the value associated with the information, at least one of a third phase and a first amplitude of the third signal input to the first coupler is the value associated with the information, and at least one of a fourth phase and a second amplitude of the fourth signal input to the second coupler is the value associated with the information.

(8) A signal processor for an outphasing amplifier according to the present disclosure includes: a first processor that acquires information relating to a power of an output signal, sets a first phase of a first signal to a value associated with the information, and outputs the first signal in which the first phase is set to a first amplifier amplifying the first signal; a second processor that acquires the information, sets a second phase of a second signal to the value associated with the information, and outputs the second signal in which the second phase is set to a second amplifier amplifying the second signal; a third processor that acquires the information, sets at least one of a third phase and a first amplitude of a third signal to the value associated with the information, and outputs the third signal in which the at least one of the third phase and the first amplitude is set to a first coupler coupling the first signal amplified by the first amplifier and the third signal; and a fourth processor that acquires the information, sets at least one of a fourth phase and a second amplitude of a fourth signal to the value associated with the information, and outputs the fourth signal in which the at least one of the fourth phase and the second amplitude is set to a second coupler coupling the second signal amplified by the second amplifier and the fourth signal; wherein the output signal is a signal in which the first signal outputted from a first impedance converter to which the first signal coupled with the third signal is inputted and the second signal outputted from a second impedance converter to which the second signal coupled with the fourth signal is inputted are combined with each other.

Specific examples of an outphasing amplifier and a signal processor for the outphasing amplifier according to an embodiment of the present disclosure will be described below with reference to the drawings. The present disclosure is not limited to these examples, but is intended to be set forth by the claims and to include all modifications within the meaning and scope of equivalents with the claims.

FIG. 1 is a block diagram of the amplifier according to the first embodiment. As illustrated in FIG. 1, in the outphasing amplifier, an amplifier 10 (first amplifier) and an amplifier 11 (second amplifier) are connected in parallel between an input terminal Tin and an output terminal Tout. A high frequency signal is input to the input terminal Tin as an input signal Sin. When an outphasing amplifier 100 is used in a base station for mobile communication, the frequency of the high frequency signal is, for example, 0.5 GHz to 10 GHz. A signal processor performs signal processing on the input signal Sin and outputs two signals S1 (first signal) and S2 (second signal).

The signal S1 is input to the amplifier 10 via a matching circuit 30. The matching circuit 30 matches an output impedance of the signal processor 20 with an input impedance of the amplifier 10. The amplifier 10 amplifies the signal S1 input through the matching circuit 30 and outputs an amplified signal S1*a* through a matching circuit 32. The signal S1*a* passed through the matching circuit 32 is combined with a signal S3 in a coupler 12. A signal S1*b* obtained by combining the signals S1*a* and S3 is input to a combiner 16. The matching circuit 32 matches an output impedance of the amplifier 10 with an input impedance of the combiner 16. The signal S2 is input to the amplifier 11 via a matching circuit 31. The matching circuit 31 matches an output impedance of the signal processor 20 with an input impedance of the amplifier 11. The amplifier 11 amplifies the signal S2 inputted through the matching circuit 31 and outputs an amplified signal S2*a* through a matching circuit 33. The signal S2*a* passed through the matching circuit 33 is combined with a signal S4 in a coupler 13. A signal S2*b* obtained by combining the signal S2*a* and the signal S4 is input to the combiner 16. The matching circuit 33 matches an output impedance of the amplifier 11 with the input impedance of the combiner 16. The combiner 16 combines the signal S1*b* and the signal S2*b*. A combined signal is output from the output terminal Tout as an output signal Sout.

A bias circuit 34 supplies a bias voltage Vg1 to a gate G of the amplifier 10 and suppresses leakage of the signal S1 to a bias terminal. A bias circuit 36 supplies a bias voltage Vd1 to a drain D of the amplifier 10 and suppresses leakage of a signal amplified by the amplifier to the bias terminal. A bias circuit 35 supplies a bias voltage Vg2 to the gate G of the amplifier 11 and suppresses leakage of the signal S2 to a bias terminal. A bias circuit 37 supplies a bias voltage Vd2 to a drain D of the amplifier 11 and suppresses leakage of a signal amplified by the amplifier 11 to the bias terminal.

The amplifiers 10 and 11 include, for example, FETs (Field Effect Transistor) 18 and 19, respectively. Sources S of the FETs 18 and 19 are grounded, the signal S1 and the signal S2 are input to the gate G via the matching circuit 30 and the matching circuit 31, respectively, and the drains D of the FETs 18 and 19 output the amplified signals, respectively. The FETs 18 and 19 are, for example, GaN HEMT (Gallium Nitride High Electron Mobility Transistor) or LDMOS (Laterally Diffused Metal Oxide Semiconductor). Each of the amplifiers 10 and 11 may be provided with multi-stage FETs. The sizes (e.g., gate widths) of the FETs 18 and 19 of the amplifiers 10 and 11 are substantially the same as each other, the gate bias voltages Vg1 and Vg2 are substantially the same as each other, and the drain bias voltages Vd1 and Vd2 are substantially the same as each other. The matching circuits 30 to 33 are designed so that high frequency characteristics such as the drain efficiency become optimum when the amplifiers 10 and 11 output saturated power, for example. This improves the high frequency characteristics such as the drain efficiency when the amplifiers 10 and 11 amplify the signals S1 and S2.

The signal processor 20 is, for example, a Signal Processing Unit, and digitally processes the input signal Sin and outputs the signals S1 and S2. The signal processor 20 sets a phase difference between the signals S1 and S2 depending on an amplitude of the input signal Sin. For example, when the amplitude of the input signal Sin is large, the phase difference between the signals S1 and S2 is reduced. When the amplitude of the input signal Sin is small, the phase difference between the signals S1 and S2 is increased. The amplitudes of the signals S1 and S2 are substantially constant regardless of the amplitude of the input signal Sin, and are set to an amplitude corresponding to the saturated power of the amplifiers 10 and 11, for example.

The signal processor 20 makes the phase difference between signals S1 and S2 close to 0° (outphasing angle is 90°) when the amplitude of input signal Sin is large, and the phase difference between signals S1 and S2 close to 180° (outphasing angle is 0°) when the amplitude of input signal Sin is small. The amplitudes of signals S1 and S2 are the amplitudes at which the amplifiers 10 and 11 most improve the high frequency characteristics such as the drain efficiency (e.g., amplitudes corresponding to the saturation power). The phase difference between the signals S1*a* and S2*a* is substantially equal to the phase difference between the signals S1 and S2. When the amplitude of the input signal Sin is large, the phase difference between the signals S1*a* and S2*a* is close to 0°, so that the amplitude of the output signal Sout becomes large. When the amplitude of the input signal Sin is small, the phase difference between the signals S1*a* and S2*a* is close to 180°, so that the amplitude of the output signal Sout becomes small. Thus, the amplitude of the output signal Sout obtained by combining the signals S1*a* and S2*a* becomes an amplitude corresponding to the amplitude of the input signal Sin. The amplifiers 10 and 11 amplify the signals S1 and S2 having the amplitude at which the efficiency is most improved. Therefore, in the outphasing amplifier 100, the high frequency characteristics such as the drain efficiency can be improved regardless of the amplitude of the input signal Sin.

Figure 2:
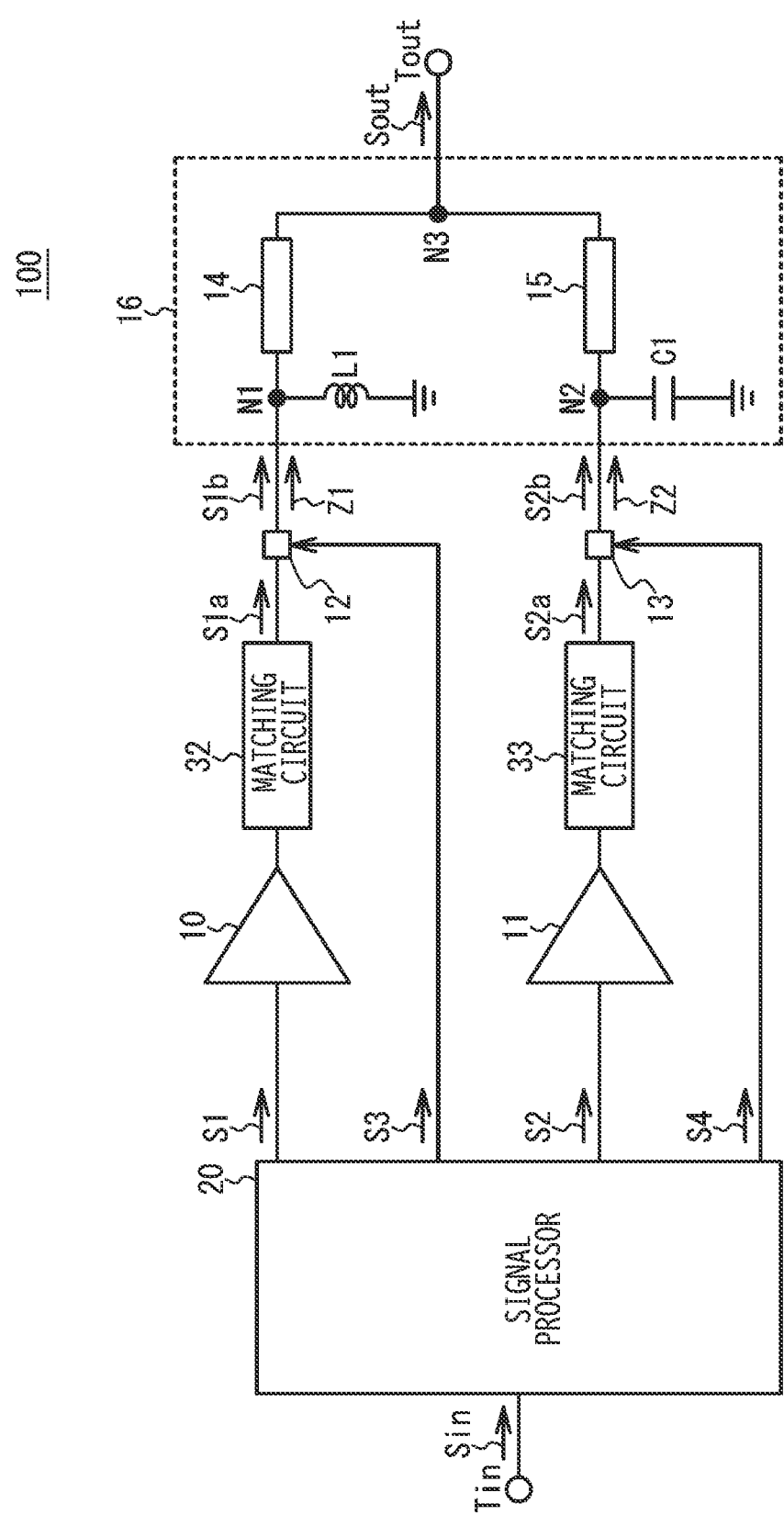
FIG. 2 is a block diagram of the amplifier according to the first embodiment.

FIG. 2 is a block diagram of the amplifier according to the first embodiment. In FIG. 2, the matching circuits 30 and 31 and the bias circuits 34 to 37 are omitted in comparison with FIG. 1. The configurations in the couplers 12 and 13 and the combiner 16 are illustrated. As illustrated in FIG. 2, the signal processor 20 outputs the signals S3 and S4 for impedance adjustment in addition to the signals S1 and S2. The coupler 12 is provided between the matching circuit 32 and the combiner 16. The coupler 12 couples the signals S1*a* and S3 and outputs them as the signal S1*b*. The coupler 13 is provided between the matching circuit 33 and the combiner 16. The coupler 13 couples the signals S2*a* and S4 and outputs them as the signal S2*b*.

The combiner 16 is, for example, the Chireix combiner. The combiner 16 includes an inductor L1, a capacitor C1, and impedance converters 14 and 15. The inductor L1 is shunt-connected to a node N1 through which the signal S1*b* passes. The capacitor C1 is shunt-connected to a node N2 through which the signal S2*b* passes. First ends of the impedance converters 14 and 15 are connected to nodes N1 and N2, respectively, and second ends of the impedance converters 14 and 15 are commonly connected to a node N3. At the node N3, the signals S1*b* and S2*b* are combined. The impedance converters 14 and 15 convert the output imped-ances of the matching circuits 32 and 33 to twice (for example, 100Ω) the standard impedance (for example, 50Ω), respectively. Thus, the impedance viewed from the output terminal Tout to the node N3 becomes a standard impedance (50Ω). The impedance converters 14 and 15 are transmission lines each having an electrical length of λ/4, for example. The "λ" is a wavelength at the center frequency of an operating frequency band of the outphasing amplifier 100.

[Description of Combiner]

Figure 3:
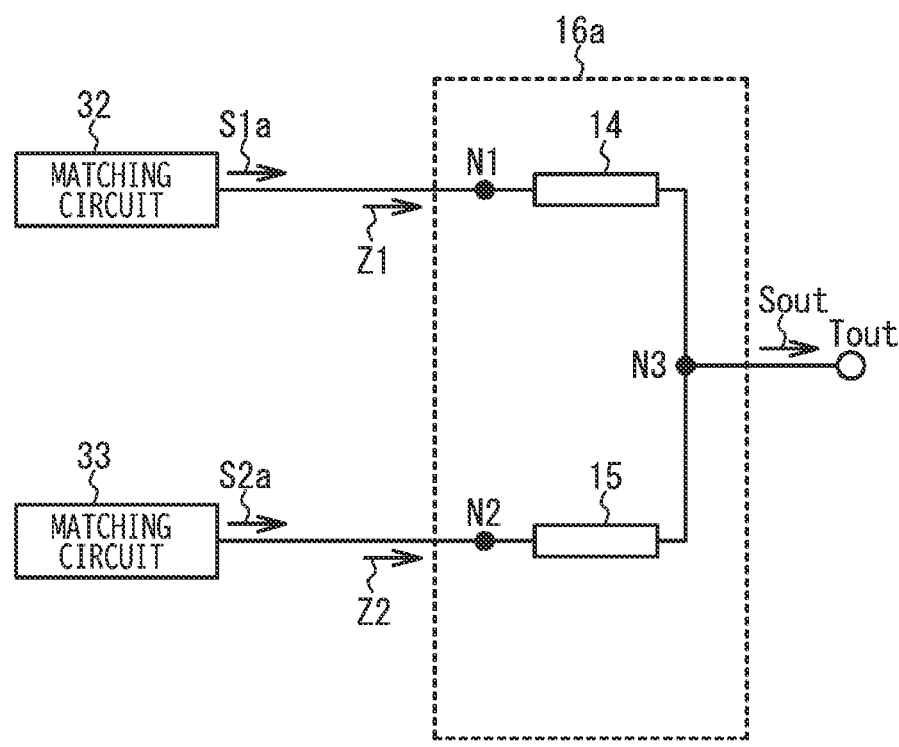
FIG. 3 is a block diagram of the periphery of a combiner according to a first comparative example.

The combiner 16 will be described with reference to a first comparative example and a second comparative example. FIG. 3 is a block diagram of the periphery of the combiner according to the first comparative example, and illustrates the matching circuits 32 and 33 and a combiner 16*a* of the outphasing amplifier according to the first comparative example. As illustrated in FIG. 3, in the first comparative example, the couplers 12 and 13 are not provided between the combiner 16*a* and the matching circuits 32 and 33. The inductor L1 and the capacitor C1 are not provided in the combiner 16*a*. Thus, the combiner 16*a* is not the Chireix combiner. Since the couplers 12 and 13 are not provided, the signals S1*a* and S2*a* are input to the combiner 16*a*. Other configurations are the same as those of the first embodiment.

Figure 4:
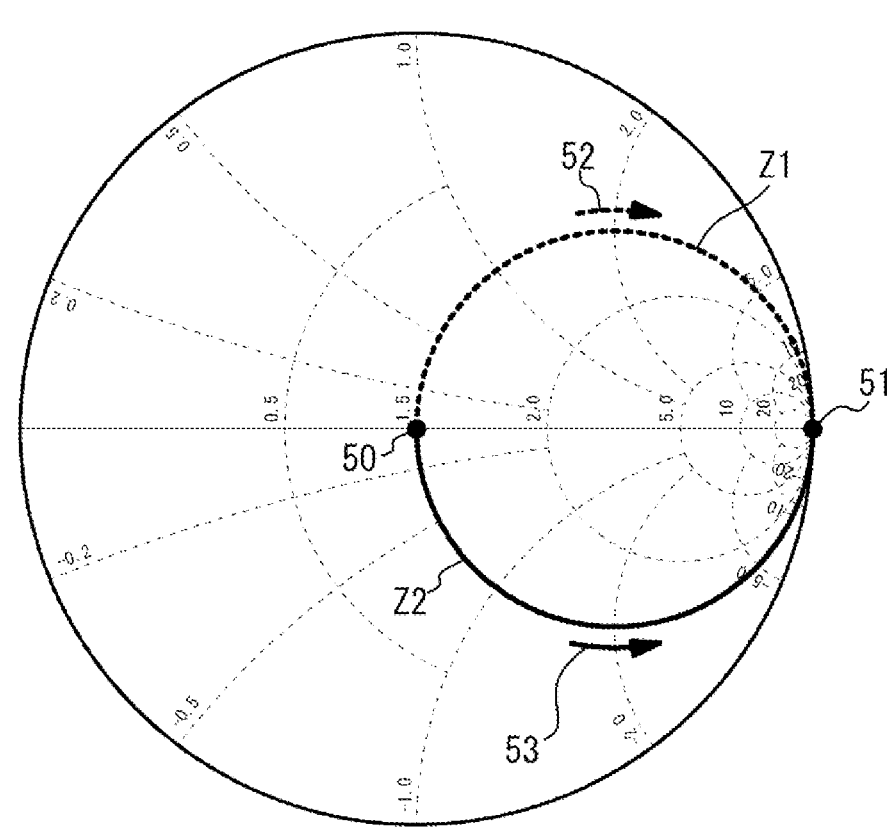
FIG. 4 is a Smith chart of an impedance according to the first comparative example.

FIG. 4 is a Smith chart of an impedance according to the first comparative example, and is a Smith chart of the impedances Z1 and Z2 viewed from the matching circuits 32 and 33 to the combiner 16*a*. As illustrated in FIG. 4, a point 50 indicates an impedance when the outphasing angle is 0° (i.e., the phase difference between signals S1*a* and S2*a* is 180°). A point 51 indicates an impedance when the outphas-ing angle is 90° (i.e., the phase difference between signals S1*a* and S2*a* is 90°). When the outphasing angle changes from 0° to 90° (i.e., the phase difference between signal S1*a* and signal S2*a* changes from 180° to 0°), an impedance Z1 moves along an upper half trace of an arc on the Smith chart of impedance from the point 50 to the point 51 as indicated by an arrow 52 and an impedance Z2 moves along a lower half trace of the arc on the Smith chart of impedance from the point 50 to the point 51 as indicated by an arrow 53. The matching circuits 32 and 33 convert the output impedances of the amplifiers 10 and 11 so that the high frequency characteristics of the amplifiers 10 and 11 become maximum (for example, the drain efficiency becomes maximum) when the impedances Z1 and Z2 are real numbers (for example, twice the standard impedance). Thus, in FIG. 4, when the impedances Z1 and Z2 are real numbers, the characteristics of the amplifiers 10 and 11 become maximum. At the points 50 and 51, the impedances Z1 and Z2 are real numbers. The range of the outphasing angle to be actually used is, for example, 20° to 70°. In this range, the reactance components (imaginary components) of impedances Z1 and Z2 are large, and the load impedances of the amplifiers 10 and 11 deviate from their optimal values.

Figure 5:
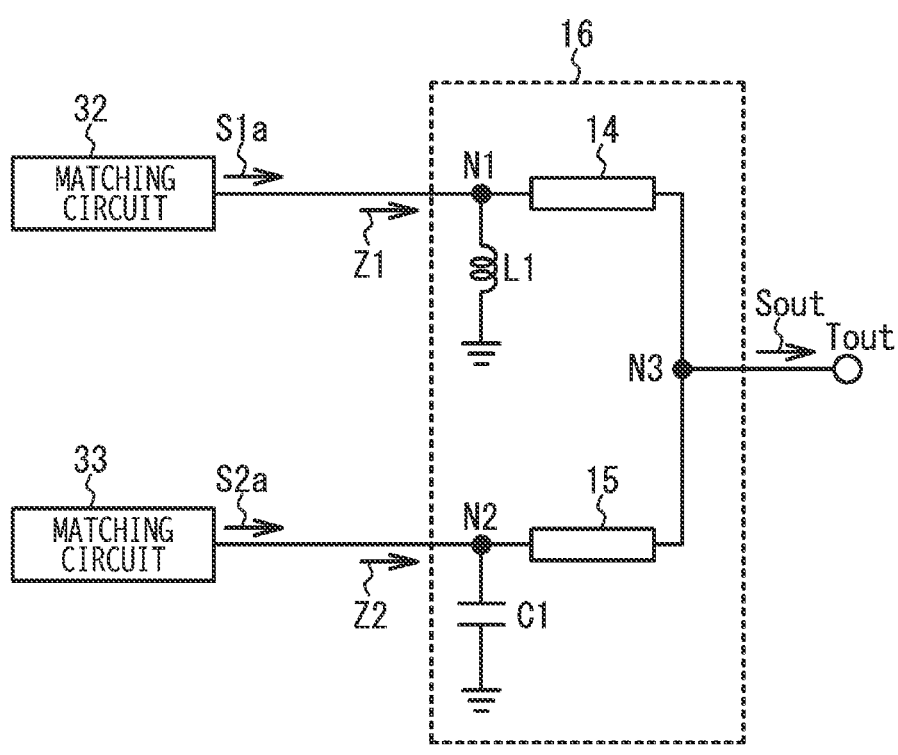
FIG. 5 is a block diagram of the periphery of a combiner according to a second comparative example.

FIG. 5 is a block diagram of the periphery of a combiner according to a second comparative example, and illustrates the matching circuits 32 and 33 and the combiner 16 of the outphasing amplifier according to the second comparative example. As illustrated in FIG. 5, in the second comparative example, the combiner 16 is Chireix combiner, and the inductor L1 is shunt-connected to the node N1 and the capacitor C1 is shunt-connected to the node N2. Since the couplers 12 and 13 are not provided, the signals S1*a* and S2*a* are input to the combiner 16. Other configurations are the same as those of the first comparative example.

Figure 6:
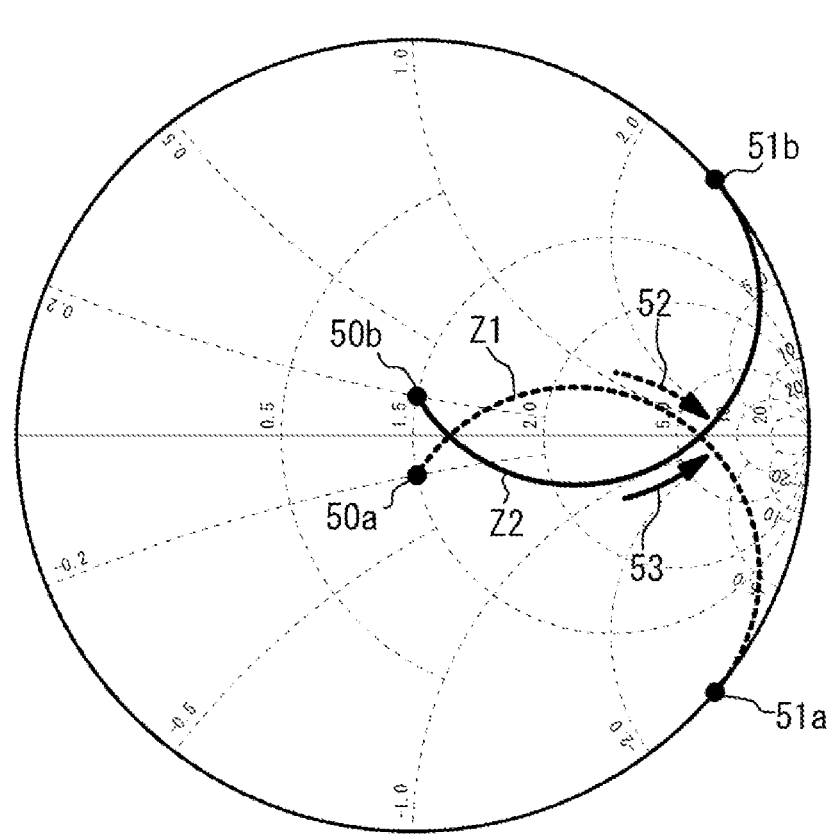
FIG. 6 is a Smith chart of an impedance according to a second comparative example.

FIG. 6 is a Smith chart of an impedance according to the second comparative example, and is the Smith chart of the impedances Z1 and Z2 viewed from the matching circuits 32 and 33 to the combiner 16. As illustrated in FIG. 6, by providing the inductor L1, the reactance component of the impedance Z1 is shifted in a positive direction and rotated in a clockwise direction as compared with FIG. 4 of the first comparative example in a state where the shape of the entire arc is maintained on the Smith chart of the impedance. By providing the capacitor C1, the reactance component of the impedance Z2 is shifted in a negative direction and rotated in a counterclockwise direction as compared with the first comparative example in a state in which the shape of the entire arc is maintained on the Smith chart of the impedance.

The reactance component of the impedance Z1 at a point 50*a* becomes negative when the outphasing angle is 0° (the phase difference is 180°), and the reactance component of the impedance Z1 at a point 51*a* becomes negative when the outphasing angle is 90° (the phase difference is 0°). In a range of the outphasing angle to be actually used (for example, 20° to 70°), the impedance Z1 approaches a real axis and the reactance component becomes small. Therefore, the load impedance of the amplifier 10 becomes close to the optimum value. The reactance component of the impedance Z2 at a point 50*b* becomes positive when the outphasing angle is 0° (the phase difference is 180°), and the reactance component of the impedance Z2 at a point 51*b* becomes positive when the outphasing angle is 0° (the phase differ-ence is 180°). In the range of the outphasing angle to be actually used (for example, 20° to 70°), the impedance Z2 approaches the real axis and the reactance component becomes small. Therefore, the load impedance of the ampli-fier 11 becomes close to the optimum value.

As described above, in the second comparative example using the Chireix combiner, the deviation of the load imped-ances of the amplifiers 10 and 11 from the optimum values can be reduced even in the range in which the phase difference between the signals S1*a* and S1*b* is actually used.

Therefore, as compared with the first comparative example, deterioration of characteristics such as high frequency characteristics can be reduced.

Figure 7:
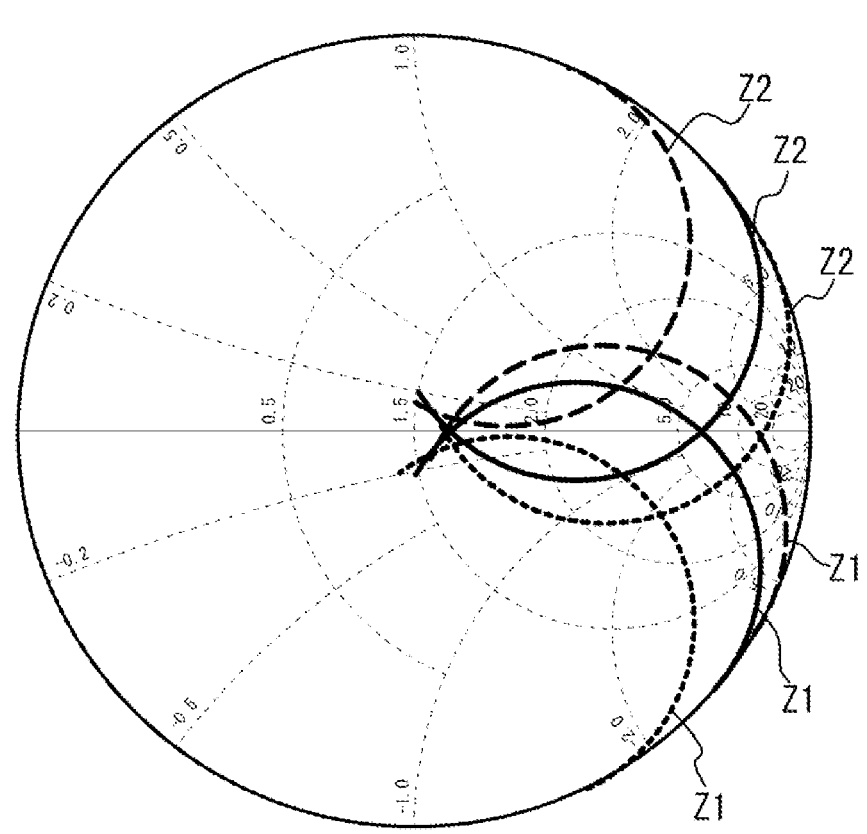
FIG. 7 is a Smith chart of the impedance according to the second comparative example.

FIG. 7 is a Smith chart of the impedance according to the second comparative example. In FIG. 7, the traces of the impedances Z1 and Z2 indicated by solid lines are the same traces as those of the impedances Z1 and Z2 illustrated in FIG. 6. In the Chireix combiner of the second comparative example, when the phases and frequencies of the signals S1 and S2 change, the impedances Z1 and Z2 on the Smith chart may move. In addition, the traces of the impedances Z1 and Z2 on the Smith chart may be different for each product. For example, as illustrated in FIG. 7, the traces of the impedances Z1 and Z2 on the Smith chart are arcs of broken lines or arcs of dotted lines. In the second comparative example, since the impedances Z1 and Z2 are fixed, the load impedances of the amplifiers 10 and 11 cannot be adjusted so as to approach the optimum values. Thus, the load impedances of the amplifiers 10 and 11 cannot be adjusted in the second comparative example using the Chireix combiner. Therefore, it is difficult to improve the high frequency characteristics such as the drain efficiency when the phases and the frequencies of the signals S1 and S2 are changed or for each product. In the first embodiment, the above-described problems which cannot be solved in the first and the second comparative examples are solved.

[Adjustment of Impedances Z1 and Z2 in First Embodiment]

Figure 8:
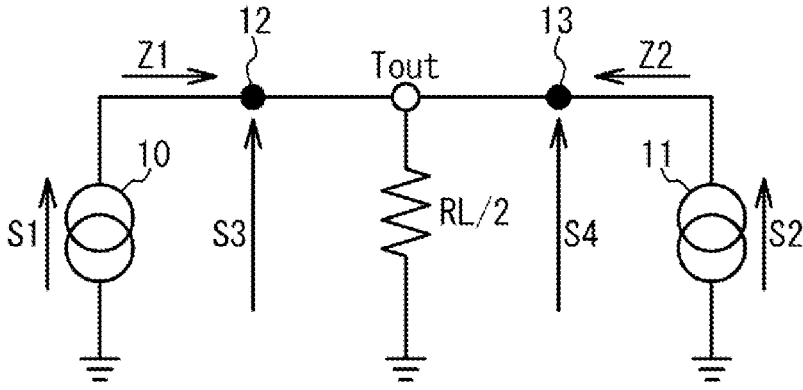
FIG. 8 is a diagram illustrating an impedance adjustment method according to the first embodiment.

FIG. 8 is a diagram illustrating an impedance adjustment method according to the first embodiment. As illustrated in FIG. 8, the amplifiers 10 and 11 are regarded as signal sources, and the signals supplied by the amplifiers 10 and 11 are referred to as S1 and S2. A load RL/2 is connected to the output terminal Tout. The coupler 12 between the amplifier 10 and the output terminal Tout couples the signals S1 and S3, and the coupler 13 between the amplifier 11 and the output terminal Tout couples the signals S2 and S4. The impedances Z1 and Z2 can be expressed as Equations 1 and 2.

$$Z1 = RL/2 \times (S1+S2+S3+S4)/(S1+S3) \qquad \text{Equation 1}$$

$$Z2 = RL/2 \times (S1+S2+S3+S4)/(S2+S4) \qquad \text{Equation 2}$$

By adjusting the phases and the amplitudes of the signals S3 and S4, the impedances Z1 and Z2 can be adjusted.

Thus, in the first embodiment, the impedances Z1 and Z2 can be adjusted. Therefore, the high frequency characteristics such as the drain efficiency can be improved when the phases and the frequencies of the signals S1 and S2 are changed or for each product. Hereinafter, a specific example of the first embodiment will be described.

[Signal Processor]

Figure 9:
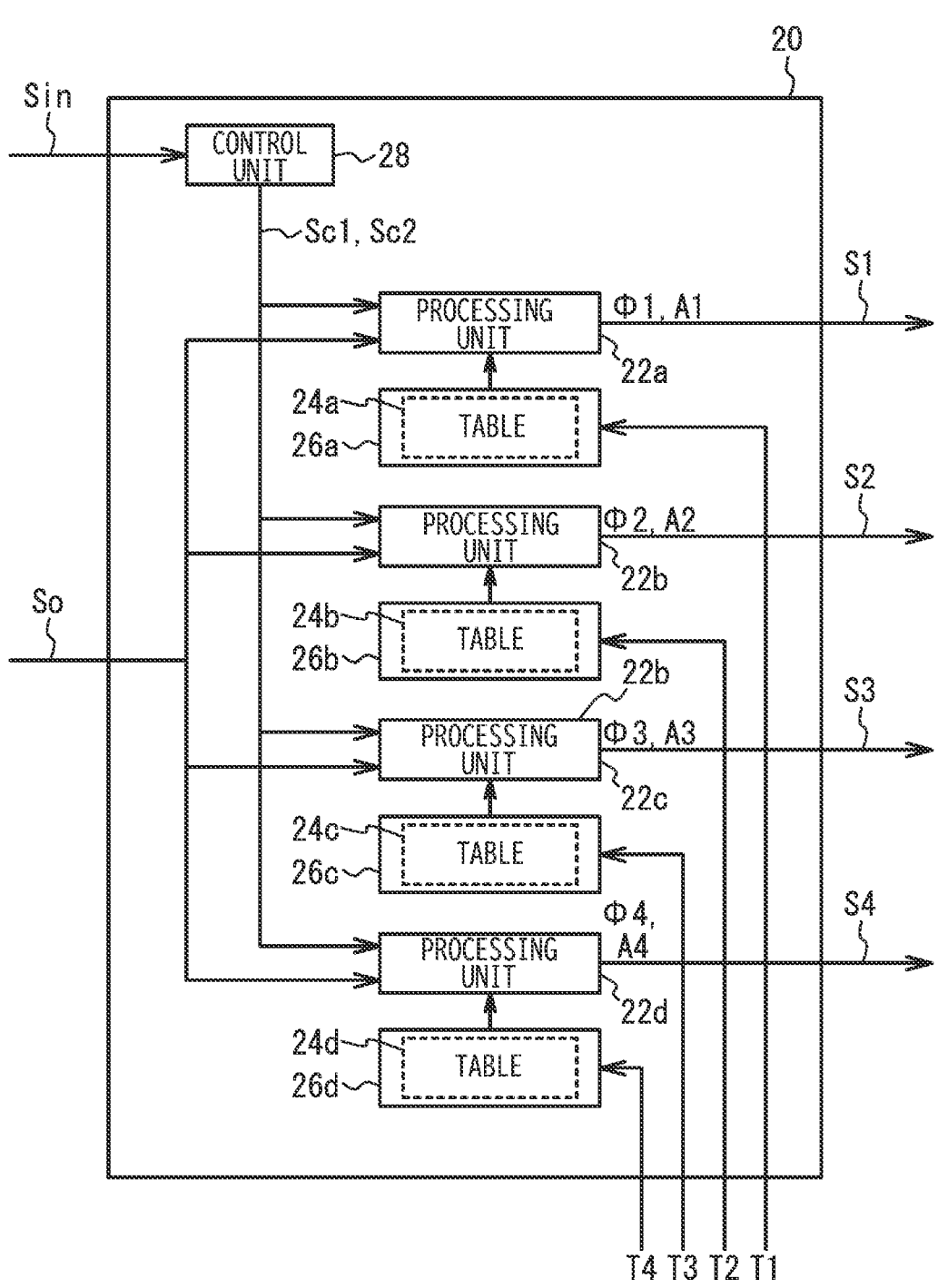
FIG. 9 is a block diagram of a signal processor according to the first embodiment.

FIG. 9 is a block diagram of the signal processor according to the first embodiment. As illustrated in FIG. 9, the signal processor 20 includes processing units 22a to 22d, memories 26a to 26d, and a control unit 28. The signal processor 20 receives the input signal Sin. The control unit 28 outputs information Sc1 relating to an output power Po of the output signal Sout based on the amplitude of the input signal Sin. For example, the amplitude of the output signal Sout is proportional to the amplitude of the input signal Sin. The control unit 28 outputs information Sc2 relating to the frequency. A high frequency signal So is input to the processing units 22a to 22d. The high frequency signal So is generated by an oscillator, for example. The phases of the high frequency signals So input to the processing units 22a to 22d are the same as each other. The tables 24a to 24d are stored in the memories 26a to 26d, respectively. In the tables 24a to 24d, information on the phase and the amplitude is associated with the information Sc1 and Sc2. The data in the tables 24a to 24d can be rewritten from the pin-ins T1 to T4, respectively.

The processing unit 22a sets the phase and the amplitude of the high frequency signal So to a phase Φ1 and an amplitude A1 associated with the information Sc1 and Sc2, and outputs the set signal S1 to the amplifier 10. The processing unit 22b sets the phase and the amplitude of the high frequency signal So to a phase Φ2 and an amplitude A2 associated with the information Sc1 and Sc2, and outputs the set signal S2 to the amplifier 11. The processing unit 22c sets the phase and the amplitude of the high frequency signal So to a phase Φ3 and an amplitude A3 associated with the information Sc1 and Sc2, and outputs the set signal S3 to the coupler 12. The processing unit 22d sets the phase and the amplitude of the high frequency signal So to a phase Φ4 and an amplitude A4 associated with the information Sc1 and Sc2, and outputs the set signal S4 to the coupler 13.

At least a part of the processing units 22a to 22d and the control unit 28 of the signal processor 20 may be realized by hardware such as a processor in cooperation with software. At least a part of the processing units 22a to 22d and the control unit 28 of the signal processor 20 may be realized by a dedicated circuit. The memories 26a to 26d are, for example, a volatile memory such as a RAM (Random Access Memory) or a non-volatile memory such as a flash memory. The memories 26a to 26d may be formed by different memory spaces in a single memory or may be formed by a plurality of memories.

[Description of Coupler]

Figure 10:
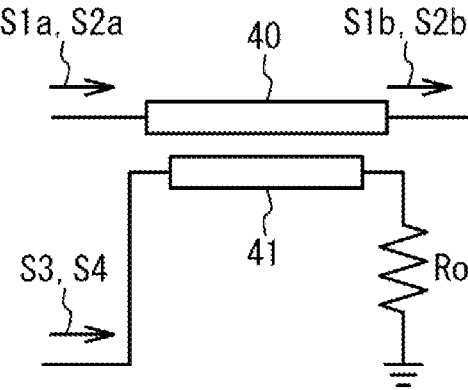
FIG. 10 is a block diagram of a coupler according to the first embodiment.

FIG. 10 is a block diagram of the coupler according to the first embodiment. As illustrated in FIG. 10, each of the couplers 12 and 13 includes a transmission line 40, and a transmission line 41 in which the signals S1a and S2a are separated from the transmission line 40. The transmission lines 40 and 41 are substantially parallel and electromagnetically coupled to each other. The characteristic impedances of the transmission lines 40 and 41 are approximately a reference impedance (e.g., 50Ω) at the frequencies of signals S1a and S2a. The signals S3 and S4 are input to a first end of the transmission line 41. A second end of the transmission line 41 is grounded via a resistor Ro. The resistor Ro is a terminating resistor, and a resistance value of the resistor Ro is a value of the characteristic impedance (for example, 50Ω). The signals S3 and S4 output from the signal processor 20 are coupled by electromagnetic field coupling between the transmission lines 40 and 41 and coupled with the signals S1a and S2a transmitted through the transmission line 40. Since the transmission line 41 is separated from the transmission line 40, the isolation between the transmission lines 41 and 40 can be increased.

Figure 11:
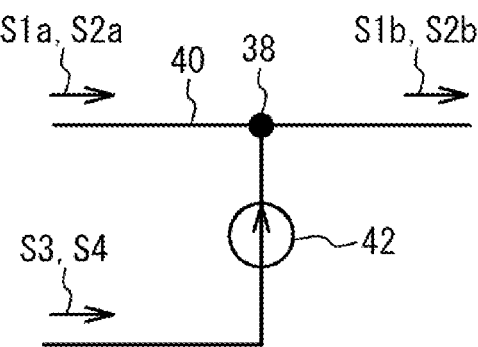
FIG. 11 is a block diagram of another example of the coupler according to the first embodiment.

FIG. 11 is a block diagram of another example of the coupler according to the first embodiment. As illustrated in FIG. 11, each of the couplers 12 and 13 includes an isolator 42. The signals S3 and S4 output from the signal processor 20 pass through the isolator 42 and are coupled to the signals S1a and S2a at a node 38, respectively. The isolator 42 suppresses leakage of the signals S1a and S2a transmitted through the transmission line 40 to the signal processor 20. The couplers 12 and 13 only need to be able to couple the signals S1a and S2a with the signals S3 and S4 respectively with less leakage of the signals S1a and S2a to the signal processor 20.

[Description of Operation of Signal Processor]

[Tables 24a-24d]

FIG. 12 is a diagram illustrating the table 24a according to the first embodiment. An item "f (Sc2)" corresponds to a frequency f and is stored in the table 24a as the information Sc2 corresponding to the frequency f. An item "Po (Sc1)" corresponds to the output power Po of the output signal Sout, and is stored in the table 24a as information Sc1 relating to the output power Po. As illustrated in FIG. 12, in the table 24a, f (Sc2) and Po (Sc1) are associated with the phase Φ1 and the amplitude A1 of the signal S1. For example, when the output power Po is Po1 and the frequency f is f1, the phase Φ1 and the amplitude A1 in the table 24a are Φ111 and Φ111, respectively. Similarly, for Po2 to Pon, the phases Φ1 are Φ112 to Φ11n, and the amplitudes A1 are A112 to A11n, respectively. Similarly, when the frequency f is f2, the phases Φ1 are Φ121 to Φ12n and the amplitudes A1 are A121 to A12n, for Po1 to Pon, respectively.

FIG. 13 is a diagram illustrating the table 24b according to the first embodiment. As illustrated in FIG. 13, in the table 24b, f (Sc2) and Po (Sc1) are associated with the phase Φ2 and the amplitude A2 of the signal S2. For example, when the output power Po is Po1 and the frequency f is f1, the phase Φ2 and the amplitude A2 in the table 24b are Φ211 and A211, respectively. Similarly, for Po2 to Pon, the phases Φ2 are Φ212 to Φ21n, and the amplitudes A2 are A212 to A21n, respectively. Similarly, when the frequency f is f2, the phases Φ2 are Φ221 to Φ22n and the amplitudes A2 are A221 to A22n, for Po1 to Pon, respectively.

FIG. 14 is a diagram illustrating the table 24c according to the first embodiment. As illustrated in FIG. 14, in the table 24c, f (Sc2) and Po (Sc1) are associated with the phase Φ3 and the amplitude A3 of the signal S3. For example, when the output power Po is from Po1 to Pon and the frequency f is f1, the phase Φ3 in the table 24c is Φ311 to Φ31n and the amplitude A3 is from A311 to A31n. Similarly, when the output power Po is Po1 to Pon and the frequency f is f2, the phase Φ3 in the table 24c is Φ321 to Φ32n, and the amplitude A3 is A321 to A32n.

FIG. 15 is a diagram illustrating the table 24d according to the first embodiment. As illustrated in FIG. 15, in the table 24d, f (Sc2) and Po (Sc1) are associated with the phase Φ4 and the amplitude A4 of the signal S4. For example, when the output power Po is Po1 to Pon and the frequency f is f1, the phase Φ4 in the table 24d is Φ411 to Φ41n and the amplitude A4 is from A411 to A41n. Similarly, when the output power Po is Po1 to Pon and the frequency f is f2, the phase 14 in the table 24d is Φ421 to Φ42n, and the amplitude A4 is A421 to A42n.

[Setting Method of Tables 24a to 24d]

Figure 16:
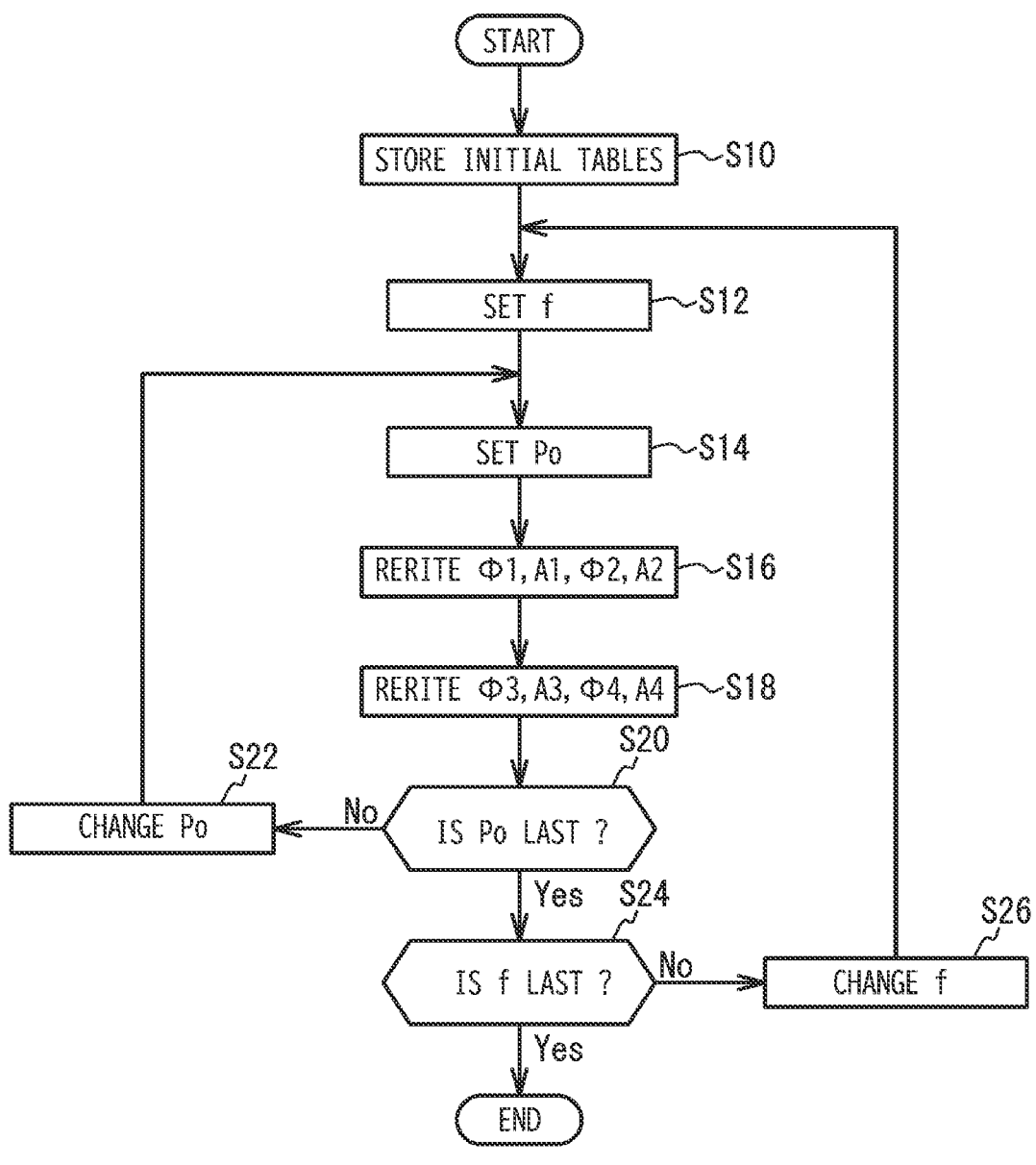
FIG. 16 is a flowchart illustrating a method of setting the tables according to the first embodiment.

FIG. 16 is a flowchart illustrating a method of setting the tables according to the first embodiment. The setting of the tables 24a to 24d is performed for each product at the time of inspection before shipping the product. The setting of the tables 24a to 24d may be performed for a plurality of products at once such as for each manufacturing lot. At least a part of the following flow may be performed by a human or automatically by a computer.

As illustrated in FIG. 16, the initial tables 24a and 24b set at the time of designing are stored in the memories 26a and 26b, respectively (step S10). The initial tables 24a and 24b are the table 24a in which the phase Φ1 and the amplitude A1 are set and the table 24b in which the phase Φ2 and the amplitude A2 are set so that the high frequency characteristics such as the drain efficiency become optimum by simulation, for example. For example, when the output power Po is small, the phases Φ1 and Φ2 of the signals S1 and S2 are set so that the phase difference between the signals S1 and S2 becomes small, and when the output power Po is large, the phases Φ1 and Φ2 of the signals S1 and S2 are set so that the phase difference between the signals S1 and S2 becomes large. The amplitudes A1 and A2 of the signals S1 and S2 are substantially the same as each other and are set so as to be the saturation powers of the amplifiers 10 and 11.

The frequency f is set (step S12). The frequency f is the frequency of the high frequency signal So and the frequency of the output signal Sout. For example, the frequency f is set to f1. The frequency of the high frequency signal So is set to f1. A target output power Po is set (step S14). For example, the target of the output power Po is set to Po1. Next, the phase Φ1 and the amplitude A1 of the signal S1 in the table 24a and the phase Φ2 and the amplitude A2 of the signal S2 in the table 24b are rewritten (step S16). For example, the phase Φ1 and the amplitude A1 of the signal S1 and the phase Φ2 and the amplitude A2 of the signal S2 are adjusted so that the output power Po becomes Po1 at the frequency f of f1 without outputting the signals S3 and S4 and the high frequency characteristics such as the drain efficiency become optimum. At this time, the phases Φ1 and Φ2 and the amplitudes A1 and A2 may be adjusted to optimize the high frequency characteristics such as the drain efficiency of both the amplifiers 10 and 11 by independently monitoring the high frequency characteristics such as the drain efficiency of both the amplifiers 10 and 11. In addition to the phases Φ1 and Φ2 and the amplitudes A1 and A2, the bias voltages of the amplifiers 10 and 11 may be adjusted. The phase Φ111 and the amplitude A111 in the table 24a are rewritten to the phase Φ1 and the amplitude A1 of the signal S1 adjusted so as to maximize the characteristics. The phase Φ211 and the amplitude A211 in the table 24b are rewritten to the amplitude A2 and the phase Φ2 of the adjusted signal S2.

The phase Φ3 and the amplitude A3 of the signal S3 in the table 24c and the phase Φ4 and the amplitude A4 of the signal S4 in the table 24d are rewritten (step S18). For example, the phase Φ1 and amplitude A1 of the signal S1 and the phase Φ2 and amplitude A2 of the signal S2 are set to the values set in step S16. The phase Φ3 and amplitude A3 of the signal S3 and the phase Φ4 and amplitude A4 of the signal S4 are adjusted so that the output power Po becomes Po1 at the frequency f of f1 and the high frequency characteristics such as the drain efficiency become optimum. The phase Φ311 and the amplitude A311 in the table 24c are rewritten to the phase Φ3 and the amplitude A3 of the signal S3 adjusted so as to maximize the characteristics. The phase Φ411 and the amplitude A411 in the table 24d are rewritten to the phase Φ4 and amplitude A4 of the adjusted signal S4.

It is determined whether the output power Po is the last (step S20). For example, when the output power Po is Po1, the determination is No because Po1 is not the last. If the determination of step S20 is No, the output power Po is changed to Po2 (step S22). Thereafter, the process proceeds to step S14. In step S16, the phase Φ1 and the amplitude A1 of the signal S1 and the phase Φ2 and the amplitude A2 of the signal S2 are adjusted so that the output power Po becomes Po2 at the frequency f of f1 without outputting the signals S3 and S4 and the high frequency characteristics such as the drain efficiency become optimum. The phase Φ112 and the amplitude A112 in the table 24a are rewritten to the adjusted phase Φ1 and the adjusted amplitude A1. The phase Φ212 and the amplitude A212 in the table 24b are rewritten to the adjusted phase Φ2 and the adjusted amplitude A2. In step S18, the phase Φ1 and the amplitude A1 of the signal S1 and the phase Φ2 and the amplitude A2 of the signal S2 are set to the values set in step S16. The phase Φ3 and the amplitude A3 of the signal S3 and the phase Φ4 and the amplitude A4 of the signal S4 are adjusted so that the output power Po becomes Po2 at the frequency f of f1 and the high frequency characteristics such as the drain efficiency become optimum. The phase Φ312 and the amplitude A312 in the table 24c are rewritten to the adjusted phase Φ3 and adjusted amplitude A3. The phase Φ412 and the amplitude A412 in the table 24d are rewritten to the adjusted phase Φ4 and the adjusted amplitude A4. Similarly, steps S16 and S18 are performed on Po2 to Pon.

In step S20, when the output power Po is Pon, the determination of step S20 is Yes, and it is determined whether the frequency f is the last (step S24). For example, when the frequency f is f1, the determination of step S24 is No because the frequency f is not the last. If the determination of step S24 is No, the frequency f is changed to f2 (step S26). Thereafter, the process proceeds to step S12. In step S14, the output power Po is set to Po1. In step S16, the phase Φ1 and the amplitude A1 of the signal S1 when the frequency f is f2 and the output power Po is Po1 are stored in the table 24a, and the phase Φ2 and the amplitude A2 of the signal S2 are stored in the table 24b. In step S18, the phase Φ3 and the amplitude A3 of the signal S3 when the frequency f is f2 and the output power Po is Po1 are stored in the table 24c, and the phase Φ4 and the amplitude A4 of the signal S4 are stored in the table 24d. Thereafter, steps S16 and S18 are performed on Po2 to Pon. When the output power Po is Pon, the determination of step S20 is Yes. In step S24, when the frequency f is f2, the determination of step S24 is Yes, and the process ends.

[Processing of Signal Processor During Operation]

Figure 17:
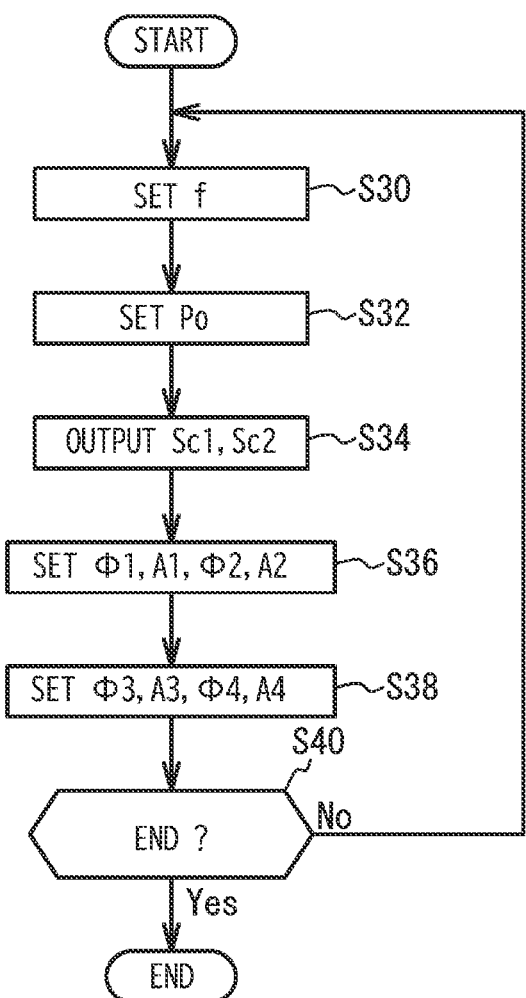
FIG. 17 is a flowchart illustrating the operation of an outphasing amplifier according to the first embodiment.

FIG. 17 is a flowchart illustrating the operation of an outphasing amplifier according to the first embodiment. As illustrated in FIG. 17, the control unit 28 sets the frequency f (step S30). The frequency f may be fixed to one frequency depending on the base station where the outphasing amplifier 100 is installed. In this case, although a plurality of frequencies f are set in the tables 24a to 24d, only one frequency f is used. The control unit 28 sets the frequency to the frequency f and thereafter does not change the frequency f. Further, the frequency f may not be set in the tables 24a to 24d. In this case, step S30 may not be performed. When the base station uses a plurality of frequency bands, the control unit 28 may appropriately select one frequency from the plurality of frequencies and set the selected frequency as the frequency f. The control unit 28 may set the frequency f based on the frequency of the input signal Sin. For example, the control unit 28 may set the frequency f equal to the frequency of the input signal Sin. The control unit 28 may cause the oscillator that outputs the high frequency signal So to output the high frequency signal So having the set frequency f.

Next, the control unit 28 sets the output power Po (step S32). For example, the control unit 28 sets the output power Po based on the amplitude (power) of the input signal Sin. For example, the power or amplitude of the input signal Sin is proportional to the output power Po. The control unit 28 outputs the information Sc1 relating to the set output power Po and the information Sc2 relating to the frequency f to the processing units 22a to 22d (step S34). The processing units 22a to 22d acquire the information Sc1 and Sc2 from the control unit 28.

The processing unit 22a sets the phase Φ1 and the amplitude A1 of the signal S1 and outputs the signal S1, and the processing unit 22b sets the phase Φ2 and the amplitude A2 of the signal S2 and outputs the signal S2 (step S36). For example, the processing unit 22a acquires information relating to the phase Φ1 and the amplitude A1 from the table 24a in the memory 26a based on the information Sc1 (information relating to the output power Po) and Sc2 (information relating to the frequency f). The processing unit 22a sets the phase Φ1 and the amplitude A1 of the signal S1 and outputs the signal S1 to the amplifier 10. The processing unit 22b acquires information relating to the phase Φ2 and the amplitude A2 from the table 24b in the memory 26b based on the information Sc1 and Sc2. The processing unit 22b sets the phase Φ2 and the amplitude A2 of the signal S2 and outputs the signal S2 to the amplifier 11.

The processing unit 22c sets the phase Φ3 and the amplitude A3 of the signal S3 and outputs the signal S3, and the processing unit 22d sets the phase Φ4 and the amplitude A4 of the signal S4 and outputs the signal S4 (step S38). For example, the processing unit 22c acquires information relating to the phase Φ3 and the amplitude A3 from the table 24c in the memory 26c based on the information Sc1 and Sc2. The processing unit 22c sets the phase Φ3 and the amplitude A3 of the signal S3 and outputs the signal S3 to the coupler 12. The processing unit 22d acquires information relating to the phase Φ4 and the amplitude A4 from the table 24d in the memory 26d based on the information Sc1 and Sc2. The processing unit 22d sets the phase Φ4 and the amplitude A4 of the signal S4 and outputs the signal S4 to the coupler 13. The control unit 28 determines whether or not the process is ended (step S40). In the case of Yes, the process ends, and in the case of No, the process returns to step S30. For example, when the control unit 28 receives a stop signal from an external device, the control unit 28 determines Yes in step S40.

In FIGS. 12 to 17, the signal processor 20 sets the phase Φ1 and the amplitude A1 of the signal S1 and the phase Φ2 and the amplitude A2 of the signal S2 based on the information Sc1 and Sc2, but the signal processor 20 may set the phases Φ1 and Φ2 of the signals S1 and S2 based on the information Sc1 and Sc2. The amplifiers 10 and 11 may be unbalanced due to a manufacturing error or the like. In such a case, the signal processor 20 preferably sets the amplitudes A1 and A2 of the signals S1 and S2 on the basis of the information Sc1 and Sc2. Further, the signal processor 20 may change the gate bias voltages of the amplifiers 10 and 11 based on the information Sc1 and Sc2. Although the signal processor 20 sets the phase Φ3 and the amplitude A3 of the signal S3 and the phase Φ4 and the amplitude A4 of the signal S4 based on the information Sc1 and Sc2, the signal processor 20 may set at least one of the phase Φ3 and the amplitude A3 of the signal S3 and at least one of the phase Φ4 and the amplitude A4 of the signal S4 based on the information Sc1 and Sc2. In order to more accurately adjust the impedances Z1 and Z2, it is preferable that the signal processor 20 sets both the phase Φ3 and the amplitude A3 of the signal S3 and sets both the phase Φ4 and the amplitude A4 of the signal S4 based on the information Sc1 and Sc2.

When the output power Po of the high frequency signal is 0 dBm and the output power Po is 30 dBm to 40 dBm, the signals S1 and S2 may not be amplified to 30 dBm to 40 dBm with a single stage of the amplifiers 10 and 11. In such a case, the amplifiers 10 and 11 may have two or more stages. Since the power of signals S3 and S4 may be small, signals S3 and S4 may not be amplified. If the power of the signals S1 and S2 is insufficient at 0 dBm, one or more amplifiers may be provided in front of the couplers 12 and 13.

According to the first embodiment, as illustrated in FIG. 2, the coupler 12 (first coupler) couples the signal S1a amplified by the amplifier 10 (first amplifier) and the signal S3 (third signal). The coupler 13 (second coupler) couples the signal S2a amplified by the amplifier 11 (second amplifier) and the signal S4 (fourth signal). The signal S1b coupled with the signal S1 is input to the impedance converter 14 (first impedance converter). The signal S2b coupled with the signal S4 is input to the impedance converter 15 (second impedance converter). The combiner 16 combines the signal output from the impedance converter 14 and the signal output from the impedance converter 15, and outputs a combined signal as the output signal Sout.

The signal processor 20 (signal processor for outphasing amplifier) sets the phase $\Phi1$ (first phase) of the signal S1 to the value associated with information Sc1 (first information), outputs the signal S1 in which the phase $\Phi1$ is set to the amplifier 10, sets the phase $\Phi2$ (second phase) of the signal S2 to the value associated with the information Sc1, and outputs the signal S2 in which the phase $\Phi2$ is set to the amplifier 11. The signal processor 20 sets at least one of the phase $\Phi3$ (third phase) and the amplitude A3 (first amplitude) of the signal S3 to the value associated with the information Sc1, and outputs the signal S3 in which at least one of the phase $\Phi3$ and the amplitude A3 is set to the coupler 12. The signal processor 20 sets at least one of the phase $\Phi4$ (fourth phase) and the amplitude A4 (second amplitude) of the signal S4 to the value associated with the information Sc1, and outputs the signal S4 in which at least one of the phase $\Phi4$ and the amplitude A4 is set to the coupler 13.

Thus, as illustrated in FIG. 8, the impedances viewed from the amplifiers 10 and 11 to the impedance converters 14 and 15 can be finely adjusted. Therefore, the impedances Z1 and Z2 can be finely adjusted when the output power Po is changed. Further, the impedance Z1 and Z2 of each product can be finely adjusted. Therefore, the high frequency characteristics such as the drain efficiency can be improved.

The signal processor 20 sets both the phase $\Phi3$ and the amplitude A3 of the signal S3 to the value associated with the information Sc1, and sets both the phase $\Phi4$ and the amplitude A4 of the signal S4 to value associated with the information Sc1. Thus, the impedances Z1 and Z2 can be more adjusted. Therefore, the high frequency characteristics such as the drain efficiency can be further improved.

The signal processor 20 sets the phase $\Phi1$ of the signal S1 to values associated with the information Sc1 and Sc2 (second information), and sets the phase $\Phi2$ of the signal S2 to values associated with the information Sc1 and Sc2. The signal processor 20 sets at least one of the phase $\Phi3$ and the amplitude A3 of the signal S3 to the values associated with the information Sc1 and Sc2, and sets at least one of the phase $\Phi4$ and the amplitude A4 of the signal S4 to the values associated with the information Sc1 and Sc2. Thus, when the frequency changes, the impedances Z1 and Z2 can be more adjusted. Therefore, the high frequency characteristics such as the drain efficiency can be further improved. In FIG. 16, a level of the frequency f is two of f1 and f2, but the level of the frequency f may be three or more.

The frequencies of the signals S1 to S4 are equal to each other. Thus, the power of the output signal Sout can be modulated by combining the signals S1 and S2. By coupling the signals S1 and S3 and coupling the signals S2 and S4, the impedances Z1 and Z2 can be finely adjusted.

The signal processor 20 includes the memories 26a to 26d. The memory 26a stores the table 24a (first table) in which information Sc1 and phase $\Phi1$ are associated with each other. The memory 26b stores the table 24b (second table) in which information Sc1 and phase $\Phi2$ are associated with each other. The memory 26c stores the table 24c (third table) in which the information Sc1 is associated with at least one of the phase $\Phi3$ and the amplitude A3. The memory 26d stores the table 24d (fourth table) in which information Sc1 is associated with at least one of the phase $\Phi4$ and the amplitude A4. The processing unit 22a (first processing unit) in the signal processor 20 sets the phase $\Phi1$ based on the table 24a. The processing unit 22b (second processing unit) sets the phase $\Phi2$ based on the table 24b. The processing unit 22c (third processing unit) sets at least one of the phase $\Phi3$ and the amplitude A3 based on the table 24c. The processing unit 22d (fourth processing unit) sets at least one of the phase $\Phi4$ and the amplitude A4 based on the table 24d. Thus, the signal processor 20 can set the phases $\Phi1$ and $\Phi2$, at least one of the phase $\Phi3$ and the amplitude A3, and at least one of the phase $\Phi4$ and amplitude A4 based on the information Sc1. The signal processor 20 may set the phases $\Phi1$, $\Phi2$, $\Phi3$, and $\Phi4$ and the amplitudes A1, A2, A3, and A4 based on the information Sc1 and Sc2 without using the tables 24a to 24d.

The combiner 16 does not have to be the Chireix combiner, but is preferably the Chireix combiner. Thereby, the high frequency characteristics such as the drain efficiency can be improved as described with reference to FIG. 6.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. An outphasing amplifier comprising:
   a first amplifier that amplifies a first signal;
   a second amplifier that amplifies a second signal;
   a first coupler that couples the first signal as amplified by the first amplifier and a third signal;
   a second coupler that couples the second signal as amplified by the second amplifier and a fourth signal;
   a first impedance converter to which the first signal coupled with the third signal is input;
   a second impedance converter to which the second signal coupled with the fourth signal is input;
   a combiner that combines the first signal as outputted from the first impedance converter and the second signal as outputted from the second impedance converter into a combined signal and that outputs the combined signal as an output signal; and
   a signal processor that generates a phase difference comprising an outphasing angle of ninety degrees (90°) or one-hundred eighty degrees (180°) between the first phase and one of a second phase, a third phase, and a fourth phase,
   wherein the signal processor:
      sets the first phase of the first signal to a value associated with first information relating to a power of the output signal, and outputs the first signal in which the first phase is set to the first amplifier, sets the second phase of the second signal to the value associated with the first information, and outputs the second signal in which the second phase is set to the second amplifier, sets at least one of the third phase and a first amplitude of the third signal to the value associated with the first information, and outputs the third signal in which the at least one of the third phase and the first amplitude is set to the first coupler, sets at least one of the fourth phase and a second amplitude of the fourth signal to the value associated with the first information, and outputs the fourth signal in which the at least one of the fourth phase and the second amplitude is set to the second coupler, sets the first phase to a value associated with the first information and second information relating to a frequency of the output signal, sets the second phase to the value associated with the first information and the second information, sets the at least one of the third phase and the first amplitude to the value associated with the first information and the second information, and sets the at least one of the fourth phase and the second amplitude to the value associated with the first information and the second information, wherein the first impedance converter and the second impedance converter are transmission lines each having an electrical length of $\lambda/4$, where $\lambda$ is a wavelength at a center frequency of an operating frequency band of the outphasing amplifier, and wherein the signal processor adjusts an impedance viewed from the first amplifier to the first impedance converter and an impedance viewed from the second amplifier to the second impedance converter by controlling the third phase, the first amplitude, the fourth phase, and the second amplitude.

2. The outphasing amplifier according to claim 1, wherein the signal processor sets the third phase and the first amplitude to the value associated with the first information, and sets the fourth phase and the second amplitude to the value associated with the first information.

3. The outphasing amplifier according to claim 1, wherein the first signal, the second signal, the third signal, and the fourth signal have a same frequency.

4. The outphasing amplifier according to claim 1, wherein the signal processor includes a memory that:

stores a first table in which the first information and the first phase are associated with each other, stores a second table in which the first information and the second phase are associated with each other, stores a third table in which the first information and the at least one of the third phase and the first amplitude are associated with each other, and stores a fourth table in which the first information and the at least one of the fourth phase and the second amplitude are associated with each other, and wherein the signal processor sets the first phase based on the first table, sets the second phase based on the second table, sets the at least one of the third phase and the first amplitude based on the third table, and sets the at least one of the fourth phase and the second amplitude based on the fourth table.

5. The outphasing amplifier according to claim 1, wherein the combiner is a Chireix combiner.

6. An outphasing amplifier comprising:

a first amplifier that amplifies a first signal;

a second amplifier that amplifies a second signal;

a first coupler that couples the first signal as amplified by the first amplifier and a third signal;

a second coupler that couples the second signal as amplified by the second amplifier and a fourth signal;

a first impedance converter to which the first signal coupled with the third signal is input;

a second impedance converter to which the second signal coupled with the fourth signal is input; and a combiner that combines the first signal as outputted from the first impedance converter and the second signal as outputted from the second impedance converter into a combined signal and that outputs the combined signal as an output signal;

wherein a first phase of the first signal input to the first amplifier is a value associated with information relating to a power of the output signal, a second phase of the second signal input to the second amplifier is the value associated with the information, at least one of a third phase and a first amplitude of the third signal input to the first coupler is the value associated with the information, and at least one of a fourth phase and a second amplitude of the fourth signal input to the second coupler is the value associated with the information, and a signal processor that generates a phase difference comprising an outphasing angle of ninety degrees (90°) or one-hundred eighty degrees (180°) between the first phase and one of the second phase, the third phase, and the fourth phase, wherein the signal processor, wherein the signal processor:

sets the first phase to a value associated with the first information and second information relating to a frequency of the output signal, sets the second phase to the value associated with the first information and the second information, sets the at least one of the third phase and the first amplitude to the value associated with the first information and the second information, and sets the at least one of the fourth phase and the second amplitude to the value associated with the first information and the second information, wherein the first impedance converter and the second impedance converter are transmission lines each having an electrical length of $\lambda/4$, where $\lambda$ is a wavelength at a center frequency of an operating frequency band of the outphasing amplifier, and wherein the signal processor adjusts an impedance viewed from the first amplifier to the first impedance converter and an impedance viewed from the second amplifier to the second impedance converter by controlling the third phase, the first amplitude, the fourth phase, and the second amplitude.

7. A signal processor for an outphasing amplifier comprising:

a first processor that acquires information relating to a power of an output signal, sets a first phase of a first signal to a value associated with the information, and outputs the first signal in which the first phase is set to a first amplifier amplifying the first signal;

a second processor that acquires the information, sets a second phase of a second signal to the value associated with the information, and outputs the second signal in which the second phase is set to a second amplifier amplifying the second signal;

a third processor that acquires the information, sets at least one of a third phase and a first amplitude of a third signal to the value associated with the information, and outputs the third signal in which the at least one of the third phase and the first amplitude is set to a first coupler coupling the first signal amplified by the first amplifier and the third signal;

a fourth processor that acquires the information, sets at least one of a fourth phase and a second amplitude of a fourth signal to the value associated with the information, and outputs the fourth signal in which the at least one of the fourth phase and the second amplitude is set to a second coupler coupling the second signal amplified by the second amplifier and the fourth signal; and wherein the output signal is a signal in which the first signal as outputted from a first impedance converter to which the first signal coupled with the third signal is inputted and the second signal as outputted from a second impedance converter to which the second signal coupled with the fourth signal is inputted are combined with each other, a signal processor that generates a phase difference comprising an outphasing angle of ninety degrees (90°) or one-hundred eighty degrees (180°) between the first phase and one of the second phase, the third phase, and the fourth phase, wherein the signal processor:

sets the first phase to a value associated with the first information and second information relating to a frequency of the output signal, sets the second phase to the value associated with the first information and the second information, sets the at least one of the third phase and the first amplitude to the value associated with the first information and the second information, and sets the at least one of the fourth phase and the second amplitude to the value associated with the first information and the second information, wherein the first impedance converter and the second impedance converter are transmission lines each having an electrical length of $\lambda/4$, where $\lambda$ is a wavelength at a center frequency of an operating frequency band of the outphasing amplifier, and wherein the signal processor adjusts an impedance viewed from the first amplifier to the first impedance converter and an impedance viewed from the second amplifier to the second impedance converter by controlling the third phase, the first amplitude, the fourth phase, and the second amplitude.

8. The outphasing amplifier according to claim 1, wherein each of the first coupler and the second coupler includes a first transmission line through which the first signal or the second signal passes, and a second transmission line that is separated from the first transmission line and electromagnetically coupled to the first transmission line, wherein the third signal or the fourth signal is input to a first end of the second transmission line, and a second end of the second transmission line is grounded via a terminating resistor.

9. The outphasing amplifier according to claim 1, wherein each of the first coupler and the second coupler includes an isolator through which the third signal or the fourth signal passes before being coupled with the first signal or the second signal.

* * * * *